United States Patent
Hegde et al.

(10) Patent No.: US 10,540,229 B2
(45) Date of Patent: Jan. 21, 2020

(54) OVERWRITING DATA OBJECTS IN A DISPERSED STORAGE NETWORK

(71) Applicant: International Business Machines Corporation, Armonk, NY (US)

(72) Inventors: Harsha Hegde, Buffalo Grove, IL (US); Venkata G. Badanahatti, Bloomingdale, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 18 days.

(21) Appl. No.: 16/017,491

(22) Filed: Jun. 25, 2018

(65) Prior Publication Data
US 2019/0391873 A1 Dec. 26, 2019

(51) Int. Cl.
G11C 29/00 (2006.01)
G06F 11/10 (2006.01)
G06F 3/06 (2006.01)
H03M 13/15 (2006.01)

(52) U.S. Cl.
CPC .......... *G06F 11/1076* (2013.01); *G06F 3/064* (2013.01); *G06F 3/067* (2013.01); *G06F 3/0619* (2013.01); *H03M 13/1515* (2013.01)

(58) Field of Classification Search
CPC .... G06F 11/1076; G06F 3/0619; G06F 3/064; G06F 3/067; G06F 11/1004; G06F 11/10; H03M 13/1515; G11B 2020/1843; G11B 2020/1836; G11B 2020/185; G11B 20/18
See application file for complete search history.

(56) References Cited

U.S. PATENT DOCUMENTS

| | | | |
|---|---|---|---|
| 8,930,375 B2 | 1/2015 | Dhuse et al. | |
| 8,996,957 B1 * | 3/2015 | Northcott | G06F 11/1012 714/763 |
| 9,058,122 B1 | 6/2015 | Nesbit et al. | |
| 9,473,732 B2 * | 10/2016 | Schmitt | H04N 5/76 |
| 9,661,074 B2 | 5/2017 | Peake | |
| 9,774,679 B2 | 9/2017 | Storm et al. | |

(Continued)

OTHER PUBLICATIONS

Anonymous; A Filesystem for Linear Tape with Overwrite Segments; Apr. 10, 2012; 10 pgs; IPCOM000216618D.

(Continued)

*Primary Examiner* — Christine T. Tu
(74) *Attorney, Agent, or Firm* — Garlick & Markinson; Timothy W. Markison; Bruce E. Stuckman

(57) ABSTRACT

A method for execution by a dispersed storage and task (DST) processing unit includes determining to determine to overwrite an original data object stored in a plurality of storage units with an updated data object. Validation level data can be determined, where the validation level data indicates a data object overwrite level, a data region overwrite level, or a data segment overwrite level. Checksum metadata associated with the original data object can be retrieved in response to determining to overwrite an original data object. Overwriting of a subset of data regions or data segments of the original data object can be foregone in response to generating validation data that indicates their checksums in the checksum metadata compare favorably to corresponding overwrite checksum values.

20 Claims, 12 Drawing Sheets

(56) References Cited

U.S. PATENT DOCUMENTS

2007/0174738 A1* 7/2007 Yoshida .......... G11B 20/10527
714/54
2018/0095826 A1 4/2018 Wozniak et al.

OTHER PUBLICATIONS

Anonymous; A method to detect and prevent memory overwrites across the memory chunks allocated within the process heap area; IP.com; May 31, 2010; 7 pgs; IPCOM000196346D.
Rupprecht et al.; SwiftAnalytics: Optimizing Object Storage for Big Data Analytics; 2017 IEEE International Conference on Cloud Engineering (IC2E); 2017; pp. 245-251; Vancouver, BC.

* cited by examiner

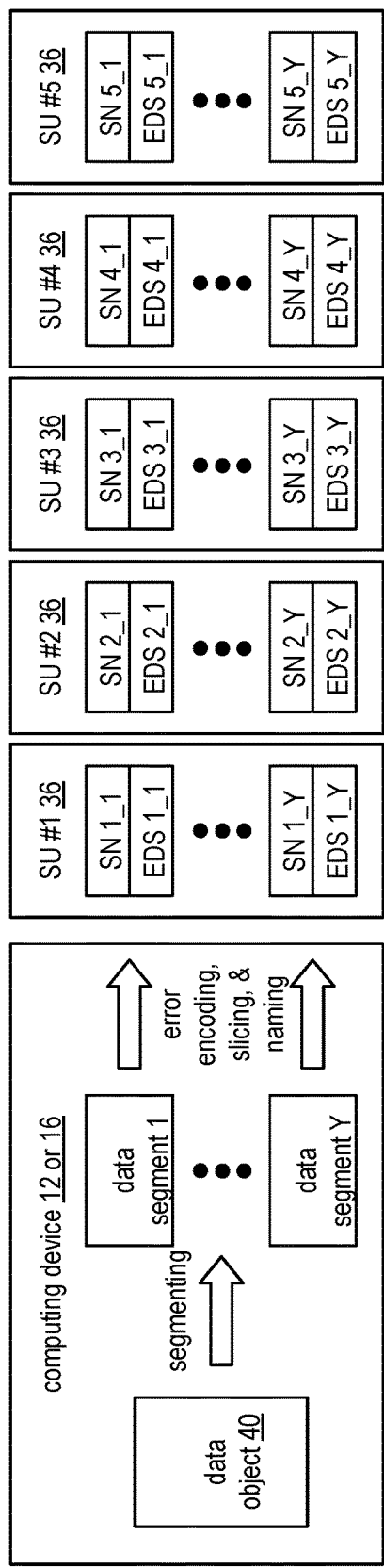
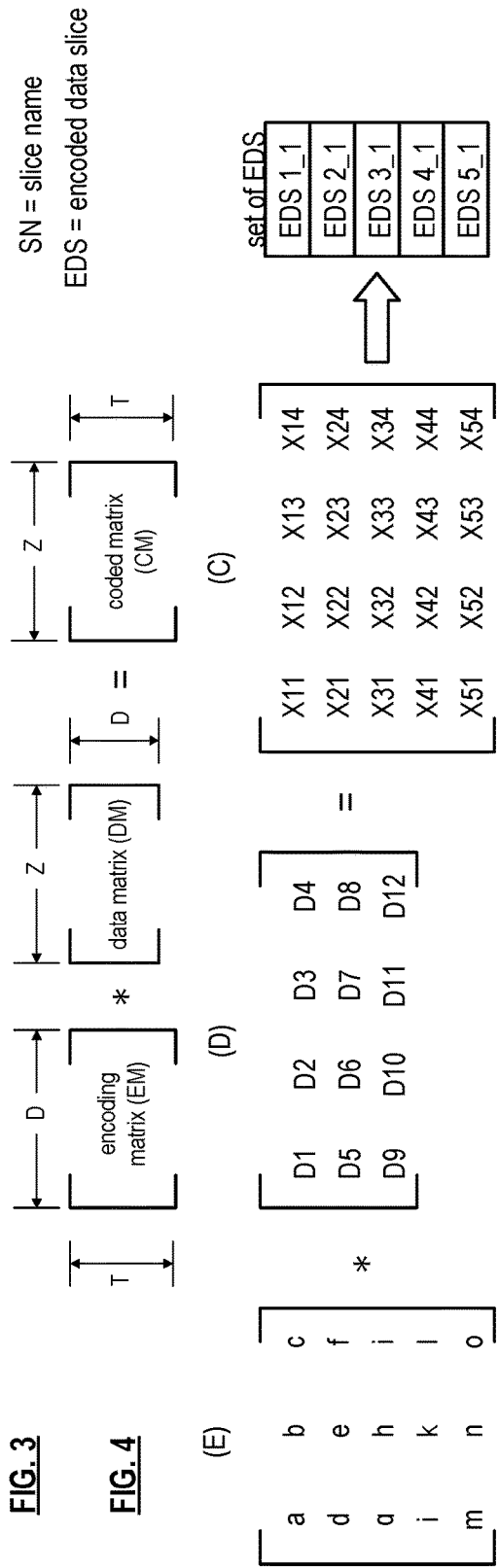
FIG. 3
FIG. 4
FIG. 5
FIG. 6

```
{
    <---- OBJECT LEVEL ----->
    "object_cksum":"XXXXXX"  ◄──── checksum 930
    <------ REGION LEVEL ----->
    "content_regions": {
        "0": {
            "region_cksum":"XXXXXX"  ◄──── checksum 940
            <-----SEGMENT LEVEL ----->
            "content_segments": {
                "0": {
                    "segment_cksum": "XXXXXX"  ◄──── checksum 940
                }
            }
        }
    }
}
``` checksum metadata format 970

FIG. 9D

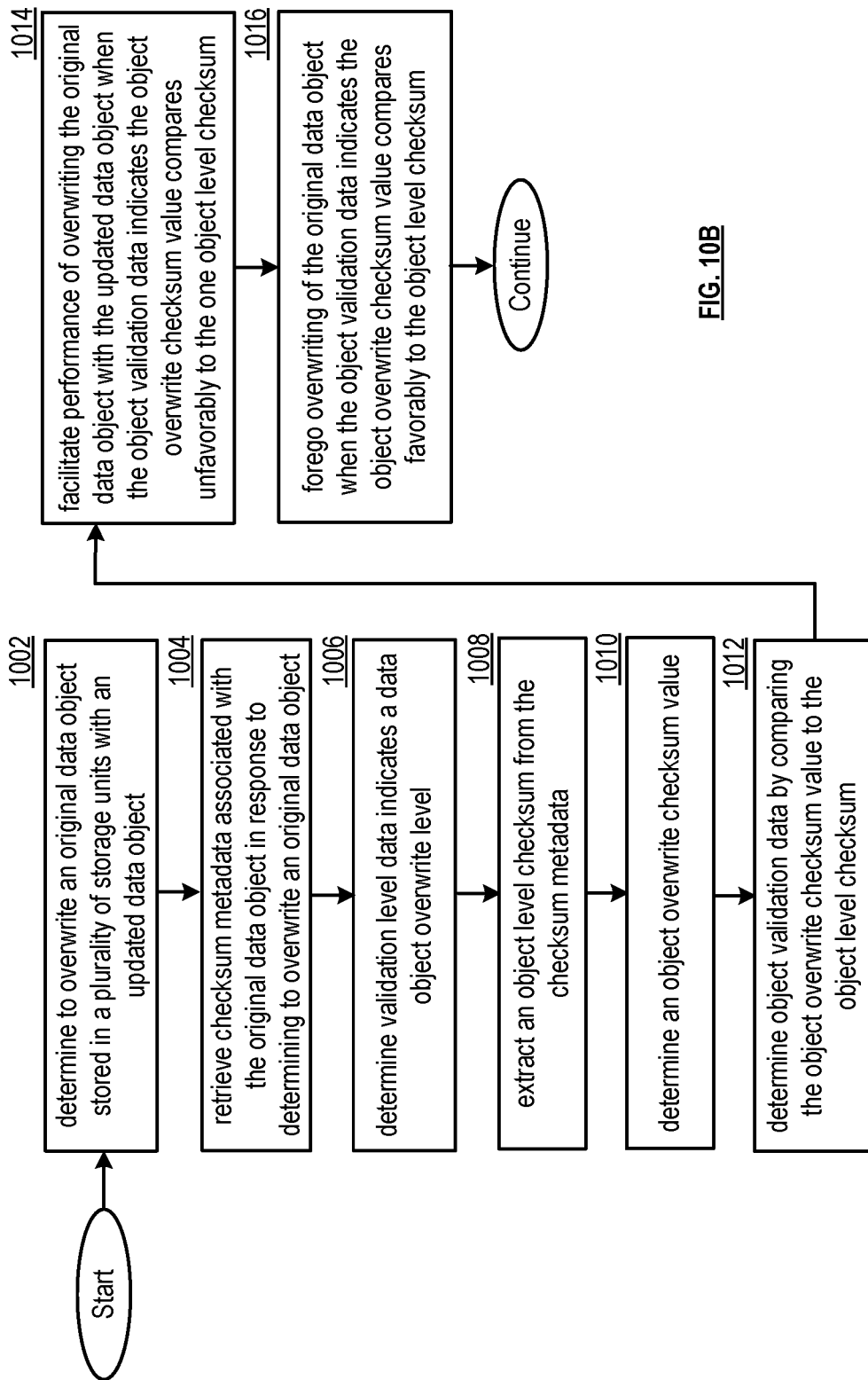

OVERWRITING DATA OBJECTS IN A DISPERSED STORAGE NETWORK

CROSS-REFERENCE TO RELATED APPLICATIONS

None

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 9D illustrates an example embodiment of a checksum metadata format in accordance with the present invention; and FIGS. 10A-10D are logic diagram of an example of a method of overwriting data objects in accordance with the present invention.

DETAILED DESCRIPTION OF THE INVENTION

Figure 1:
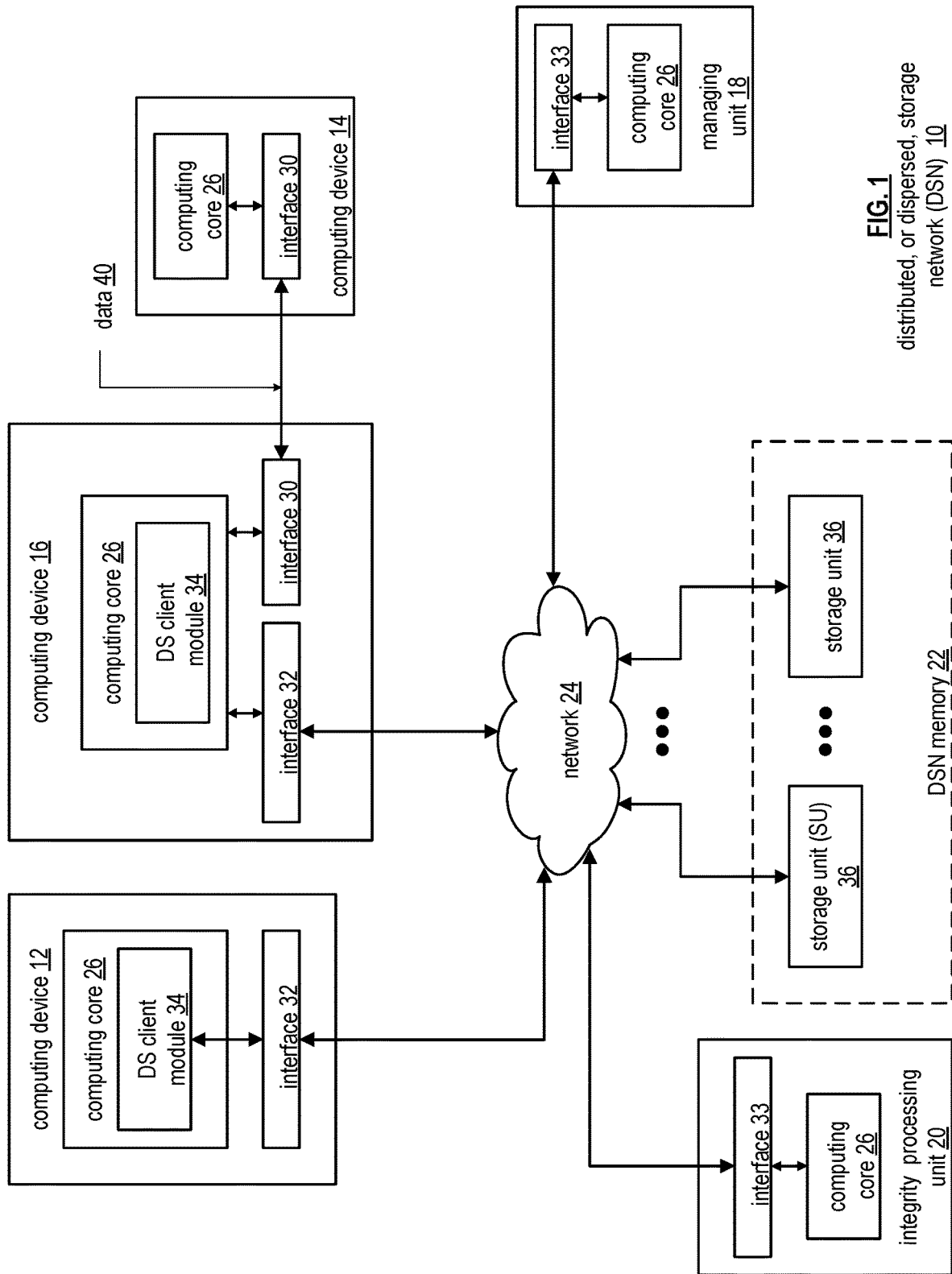
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
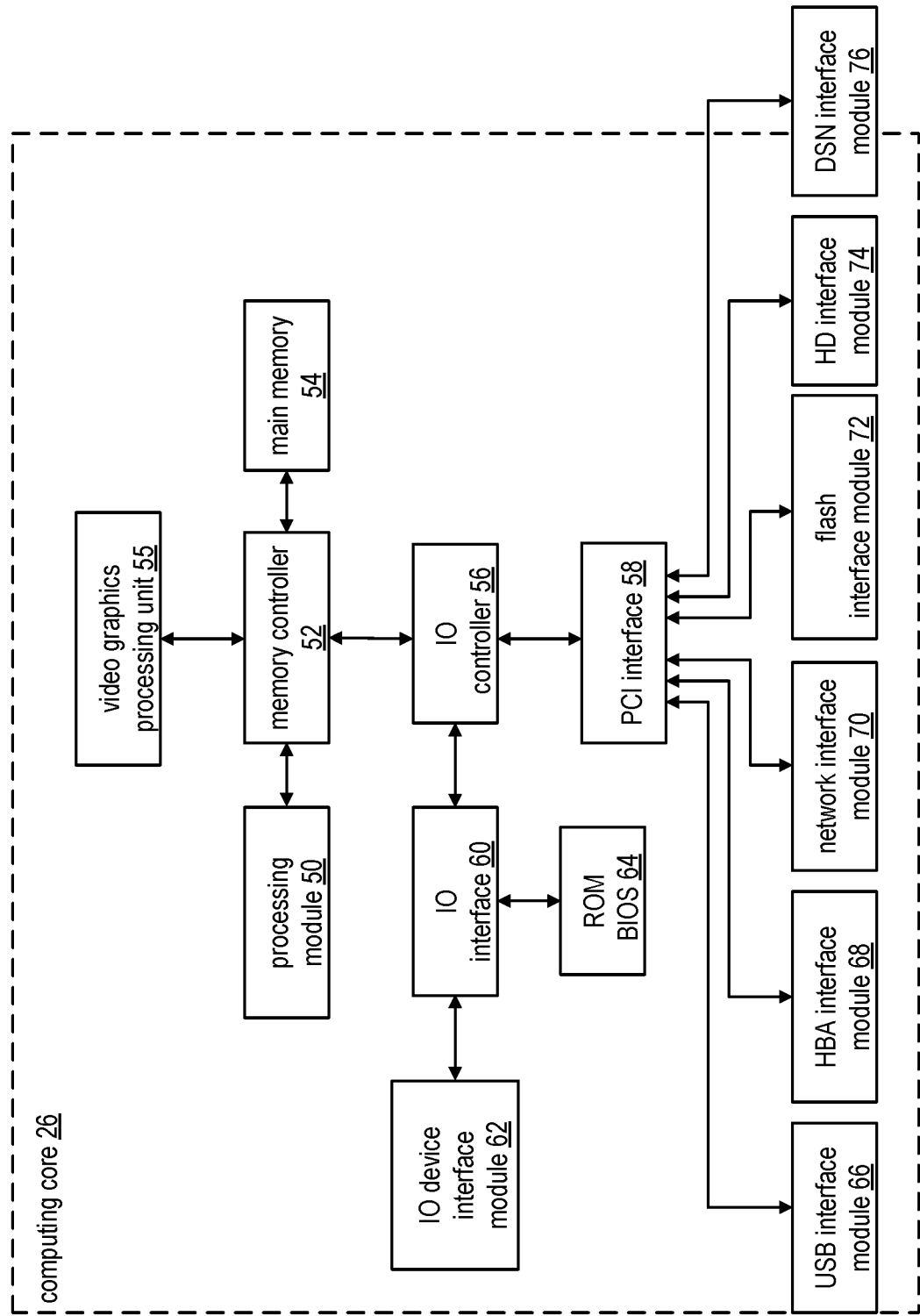
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

In various embodiments, each of the storage units operates as a distributed storage and task (DST) execution unit, and is operable to store dispersed error encoded data and/or to execute, in a distributed manner, one or more tasks on data. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, etc. Hereafter, a storage unit may be interchangeably referred to as a dispersed storage and task (DST) execution unit and a set of storage units may be interchangeably referred to as a set of DST execution units.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each managing unit 18 and the integrity processing unit 20 may be separate computing devices, may be a common computing device, and/or may be integrated into one or more of the computing devices 12-16 and/or into one or more of the storage units 36. In various embodiments, computing devices 12-16 can include user devices and/or can be utilized by a requesting entity generating access requests, which can include requests to read or write data to storage units in the DSN.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. Here, the computing device stores data object 40, which can include a file (e.g., text, video, audio, etc.), or other data arrangement. The dispersed storage error encoding parameters include an encoding function (e.g., information dispersal algorithm (IDA), Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides data object 40 into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figures 7, 8:
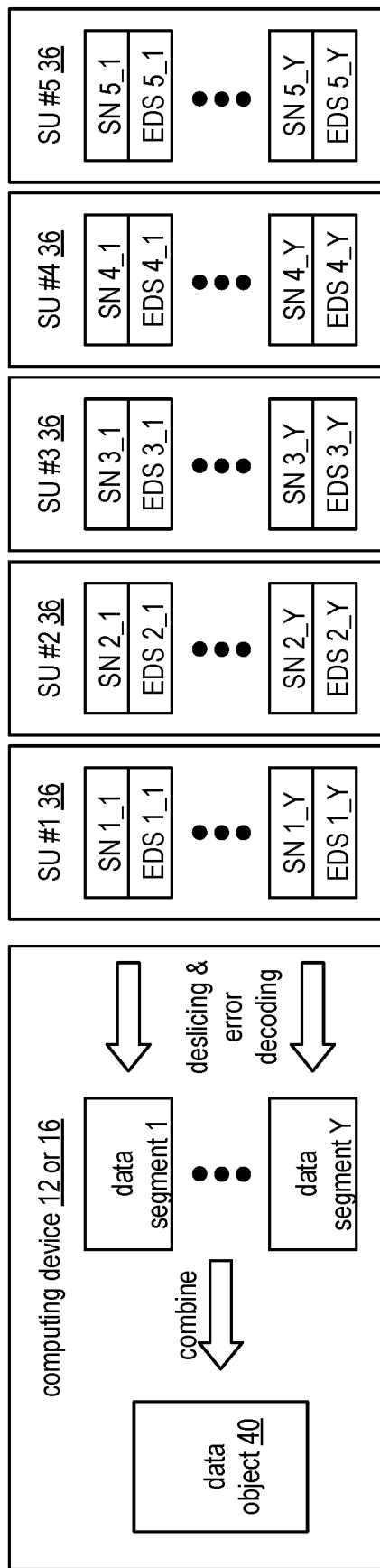
FIG. 7 is a schematic block diagram of an example of dispersed storage error decoding of data in accordance with the present invention.
FIG. 8 is a schematic block diagram of a generic example of an error decoding function in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9A:
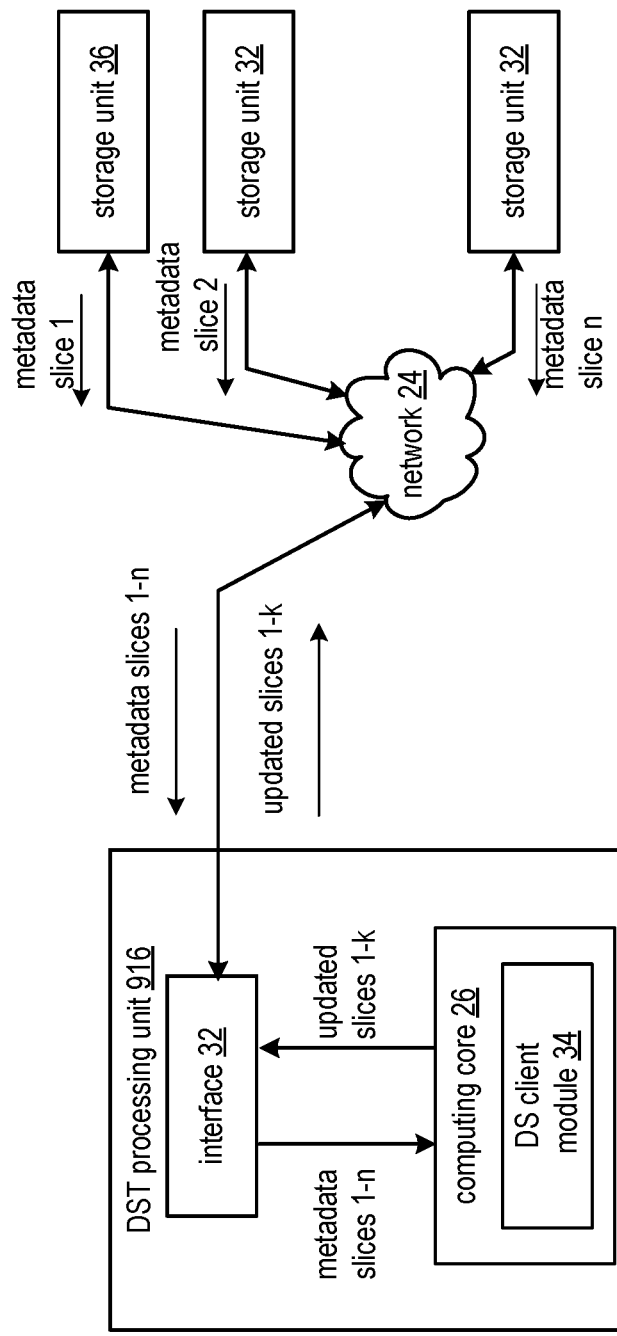
FIG. 9A is a schematic block diagram of an embodiment of a dispersed or distributed storage network (DSN) in accordance with the present invention.

FIG. 9A is a schematic block diagram of another embodiment of a dispersed storage network (DSN) that includes a DST processing unit 916, the network 24 of FIG. 1, and a plurality of storage units 1-n. The DST processing unit 916 can include the interface 32 of FIG. 1, the computing core 26 of FIG. 1, and the DS client module 34 of FIG. 1. The DST processing unit 916 can be implemented by utilizing a computing device 16, functioning as a dispersed storage processing agent for computing device 14 as described previously. Each storage unit may be implemented utilizing the storage unit 36 of FIG. 1. The DSN functions to overwrite data objects in a dispersed storage network.

In a DSN memory, an object overwrite can involve completely rewriting the object to storage and updating the existing metadata to point to the newly written object for a successful overwrite. For large objects, this can be a cumbersome process irrespective of the amount of changes between the existing data already in storage and the new data that is planned to be written for the same object name. For applications that frequently update objects irrespective of the amount of change since last write, the object overwrites can eat up resources on the system if there is a significant number of overwrites across the system with small amount of append changes between the different versions of objects.

It can be desirable to have an object storage system that supports smart overwrites by allowing individual pieces of a data object to be updated or modified without requiring a complete rewrite of the data object. This can be accomplished comparing checksums for the whole object being overwritten, checksums for the regions of the object being overwritten, and/or or checksums for the segments of the object being overwritten.

Figure 9B:
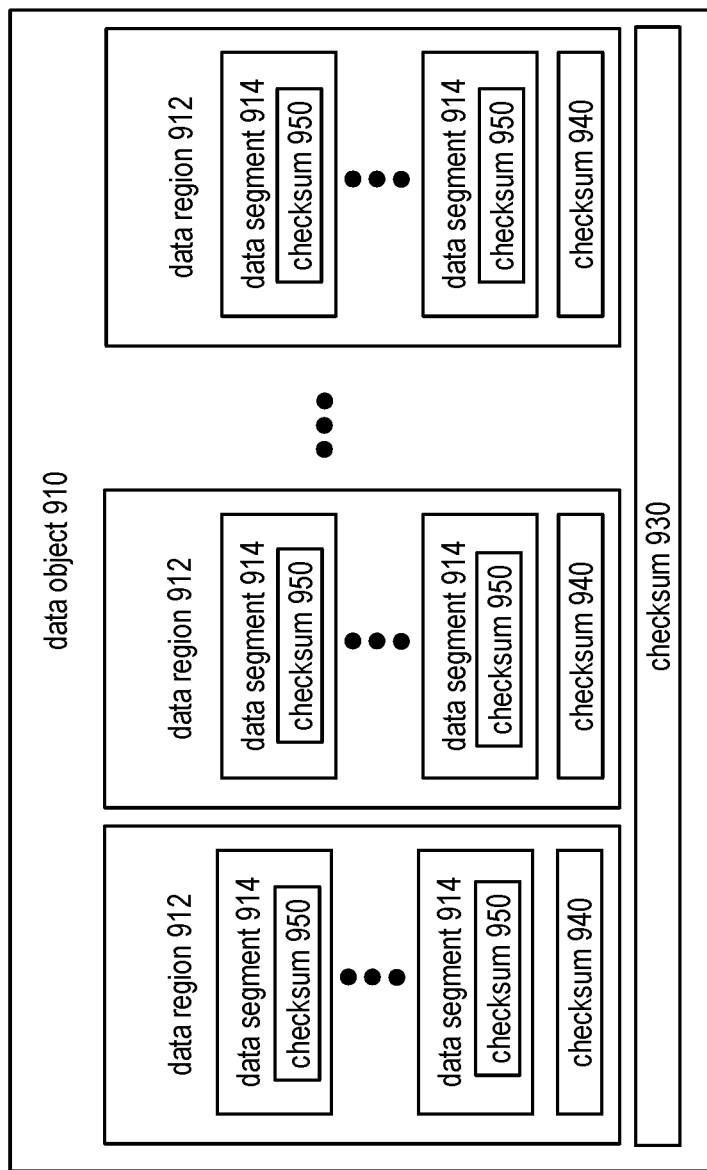
FIGS. 9B-9C are schematic block diagrams of an embodiment of a data object in accordance with the present invention.
Figure 9C:
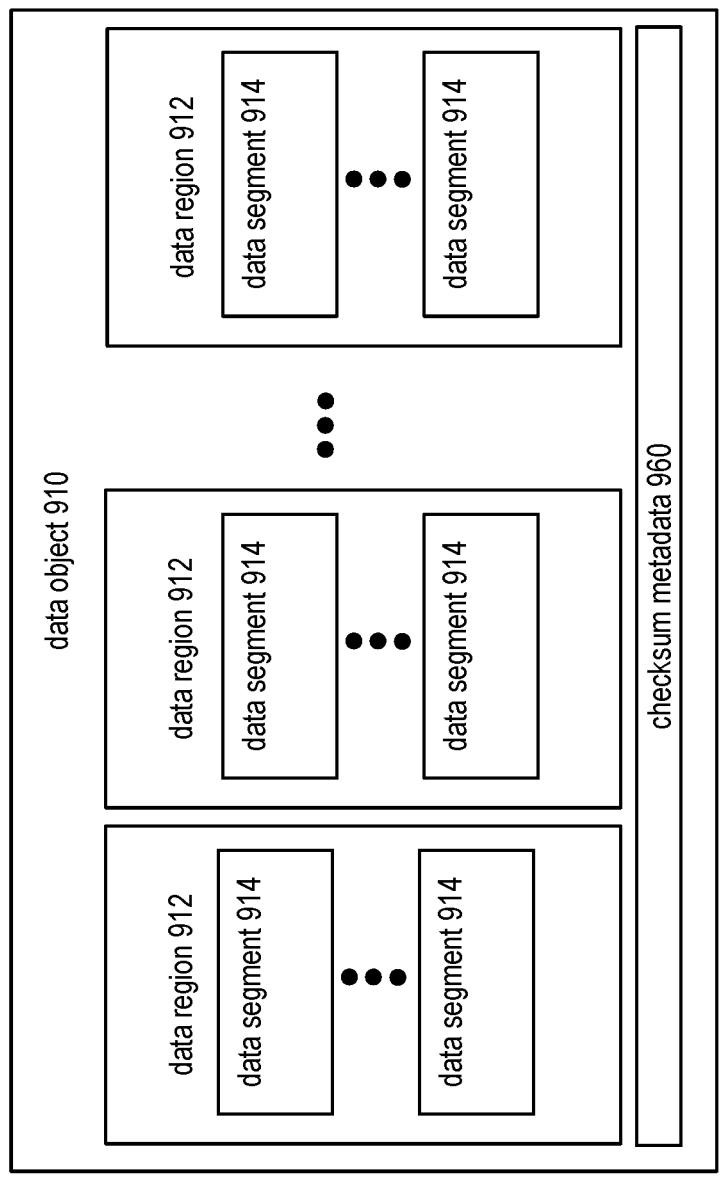

As shown in FIGS. 9B and 9C, a data object 910 can include a plurality of data regions 912. Furthermore, some or all data regions 912 can further include a plurality of data segments 914, such as data segments used to apply an IDA in a DSN based memory system as discussed herein. In some embodiments, the individual pieces of the object can include the object as a whole.

A DSN based memory system, such as one or more of the DST processing unit, computing device 12-16, storage unit 36, managing unit 18, integrity processing unit 20, or any computing core 26 or DS client module 34, can track object checksums for data objects stored in memory. One or more checksums can be received, for example, from a client device, and/or can be calculated by DST processing unit upon storing the original object in memory by performing one or more checksum functions on the original data object. Individual regions and/or segments of a data object can also have their own corresponding checksums that are computed and tracked in the metadata. For example, as shown in FIG. 9B, checksums 930, 940, and 950, can be computed, tracked, and/or stored, where checksum 930 correspond to the checksum of data object 910 as a whole, where each checksum 940 corresponds to a checksum for the corresponding data region 912, and where each checksum 950 corresponds to a checksum for the corresponding data segment 914.

The level at which check summing is tracked can be configurable for a user, can be configurable for each data object, and/or can be configurable for the DSN as a whole. For example, check summing could be turned on for tracking at the object level only, at the region level only, or at the segment level only. Once checksum tracking is enabled, the object, region and/or segment checksums of the metadata can be compared against checksums generated for object overwrites and data may be only written if needed at the object, region and segment levels in case of checksum mismatch, or the checksum in the metadata otherwise comparing unfavorably to the corresponding generated checksum. The metadata can be updated as needed for overwrites to reflect updates or changes based on new data written for the object, regions, and/or segments, where updated checksums 930, 940, and/or 950 are generated in response to data being overwritten.

One or more checksums of the object can be stored in metadata of the object itself, can be stored in a look-up table mapped to the object and/or mapped to segments of the object. While FIG. 9B depicts each checksum being stored in conjunction with its corresponding data object, region, or segment, all of the checksums 930, 940, and 950 of a data object can be tracked and stored in checksum metadata 960, as shown in FIG. 9C. Thus, the checksum metadata 960 can include a checksum for the object as a whole, as well as checksums for each region, and nested checksums for segments of each region. In some embodiments, an API interface associated with the checksum metadata supports an object level checksum header "Content-MD5", which can correspond to the content checksum that can be stored in the metadata for object level checksum verification for overwrite. In some embodiments, the checksum metadata 960 stores the checksums 930, 940, and 950 in a nested, checksum metadata format 970 as illustrated in FIG. 9D.

In some embodiments, one or more checksums stored in the metadata are dispersed error encoded in accordance with the rest of the data as described herein by utilizing an IDA, and comparing the checksum to a newly generated checksum includes retrieving the data slices that include the stored checksum from a plurality of storage units for decoding to recover the original checksum. A DSN memory based storage system can have checksum tracking enabled at the object, region, and/or segment level. In response to determining to facilitate execution of an object overwrite, the DST processing unit can first obtain the metadata for the existing object, for example, by retrieving the corresponding slices from memory and performing the decoding function to reproduce the metadata, and/or by otherwise retrieving the metadata corresponding to the object, as illustrated in FIG. 9A.

The DST processing unit can check the object level, region level and/or segment level checksums for the object once the metadata for the existing object is retrieved, based on the tracking level. For example, the DST can determine the corresponding checksum for the overwrite object as a whole, for one or more regions of the overwrite object corresponding to the region of the object to be overwritten, and/or for one or more segments of the overwrite object corresponding to a segment of the object to be overwritten. The DST processing unit can compare this computed checksum to the corresponding checksum of the metadata to determine whether the checksums match, or otherwise compare favorably. If the checksums of the overwrite object, region or segment match the checksums of the previously written object in memory, then the DST processing unit can determine to skip writing of the object, region or segment. If any checksums do not match, or otherwise compare unfavorably, the DST processing unit can determine to overwrite the corresponding object, region, or segment. For example, the DST processing unit can generate new an updated set of slices 1-k of the overwrite object for storage in memory to replace the original slices 1-k of the object, region, or segment of the original data object with the mismatched checksums, as illustrated in FIG. 9A. If there is a memory pressure on a DST processing unit for object overwrites due to storing of the data in memory to compute checksum, then the DST processing unit could bypass check summing and do a full overwrite automatically.

In various embodiments, a processing system of a dispersed storage and task (DST) processing unit includes at least one processor and a memory that stores operational instructions, that when executed by the at least one processor cause the processing system to determine to overwrite an original data object 910 stored in a plurality of storage units with an updated data object. For example, the DST processing unit can receive the updated data object to overwrite the original data object. As another example, the DST processing unit can receive an edit and/or append to be made to the original data object, where the updated data object is determined to reflect the edit or append. The original data object can include a plurality of data regions 912, and each of the plurality of data regions can include a plurality of data segments 914. In some embodiments, each of the plurality of data segments was dispersed storage error encoded to produce a set of encoded data slices stored in a set of storage units of the plurality of storage units.

Validation level data can be determined, where the validation level data indicates one data object overwrite level, a data region overwrite level, or a data segment overwrite level. For example, the validation level data can be received from a client device, where the validation level data is generated based on user input to the client device. In some embodiments, the validation level data is determined as a function of an update frequency level of the original data object. For example, the data object overwrite level can be selected for a first data object, and the data segment overwrite level can be selected for a second data object in response to determining the second data object is updated more frequently than the first data object. In some embodiments, the validation level data is determined as a function of a size of the original data object. For example, the data object overwrite level can be selected for a first data object, and the data segment overwrite level can be selected for a second data object in response to determining the second data object is larger than the first data object.

Checksum metadata 960 associated with the original data object can be retrieved in response to determining to overwrite an original data object. The checksum metadata can include one object level checksum 930 corresponding to the original data object. Alternatively or in addition, the checksum metadata can further include a plurality of region level checksums 940 corresponding to the plurality of data regions of the original data object. Alternatively or in addition, the checksum metadata can further include a plurality of segment level checksums 950 corresponding to the plurality of data segments of the plurality of data regions.

In some embodiments, the checksum metadata is generated by the DST processing unit in response to storing the original data object 910, for storage in conjunction with the original data object. For example, when the validation level data indicates a data object overwrite level, the checksum metadata can only include the object level checksum, based on the DST processing unit previously generating the object level checksum for the original data object in response to the validation level data indicating a data object overwrite level. As another example, when the validation level data indicates a data region overwrite level, the checksum metadata can only include the plurality of region level checksums, based on the DST processing unit previously generating the plurality of region level checksum for the plurality of data regions of the original data object in response to the validation level data indicating a data region overwrite level. As another example, when the validation level data indicates a data segment overwrite level, the checksum metadata can only include the plurality of segment level checksums, based on the DST processing unit previously generating the plurality of segment level checksums for the plurality of data segments of the original data object in response to the validation level data indicating a data segment overwrite level. As another example, the DST processing unit can generate the checksum metadata to include any combination of the one object level checksum, some or all of the plurality of region level checksums corresponding to some or all of the plurality of data regions of the original data object, and some or all of the plurality of segment level checksums corresponding to some or all of the plurality of data segments of the plurality of data regions.

When the validation level data indicates a data object overwrite level, an object level checksum can be extracted from the checksum metadata, and an object overwrite checksum value, corresponding to the updated data object, can be determined. For example, the object overwrite checksum value can be calculated by performing an object checksum function on the updated data object. Object validation data can be generated by comparing the object overwrite checksum value to the object level checksum. The DST processing unit can facilitate performance of overwriting the original data object with the updated data object when the object validation data indicates the object overwrite checksum value compares unfavorably to the one object level checksum. The DST processing unit can forego overwriting of the original data object when the object validation data indicates the object overwrite checksum value compares favorably to the object level checksum and/or can transmit a notification indicating the determination to forego the overwriting of the original data object.

When the validation level data indicates a data region overwrite level a plurality of region level checksums are extracted from the checksum metadata, where the plurality of region level checksums correspond to the plurality of data regions of the original data object. A plurality of region overwrite checksum values are determined. For example, each of the plurality of region overwrite checksum values can be calculated by performing a region checksum function on a corresponding one of the plurality of data regions of the updated data object.

Region validation data can be generated by comparing each of the plurality of region level checksums to a corresponding one of the plurality of region overwrite checksum values. The region validation data can indicate a first subset of the plurality of data regions of the original data object, corresponding to a first subset of the plurality of region level checksums that compare unfavorably to a corresponding first subset of the plurality of region overwrite checksum values. The region validation data can indicate a second subset of the plurality of data regions of the original data object, corresponding to a second subset of the plurality of region level checksums that compare favorably to a corresponding second subset of the plurality of region overwrite checksum values. The first subset of the plurality of data regions and the second subset of the plurality of data regions can be mutually exclusive and collectively exhaustive with respect to the plurality of data regions of the original data object.

In various embodiments, generating the region validation data includes comparing only a selected subset of the plurality of region level checksums to a corresponding subset of the plurality of region overwrite checksum values. For example, the selected subset can be identified based on a determination to overwrite only a portion of the data object that includes a subset of the plurality of data regions corresponding to the selected subset of the plurality of region level checksums. In particular, based on the edit or append determined for update, the DST processing unit can determine the selected subset of the plurality of regions to be checked, and can generate region validation data with respect to only the selected subset of the plurality of regions.

The DST processing unit can facilitate performance of overwriting the first subset of the plurality of data regions of the original data object with a corresponding first subset of a plurality of data regions of the updated data object. The DST processing unit can forego overwriting of the second subset of the plurality of data regions of the original data object and/or can transmit a notification indicating the determination to forego the overwriting of the original data object.

When the validation level data indicates a data segment overwrite level a plurality of segment level checksums can be extracted from the checksum metadata, where the plurality of segment level checksums correspond to the plurality of data segments of the original data object. A plurality of segment overwrite checksum values can be determined. For example, each of the plurality of segment overwrite checksum values can be calculated by performing a segment checksum function on a corresponding one of the plurality of data segments of the updated data object.

Segment validation data can be generated by comparing each of the plurality of segment level checksums to a corresponding one of the plurality of segment overwrite checksum values. The segment validation data can indicate a first subset of the plurality of data segments of the original data object, corresponding to a first subset of the plurality of segment level checksums that compare unfavorably to a corresponding first subset of the plurality of segment overwrite checksum values. The segment validation data can indicate a second subset of the plurality of data segments of the original data object, corresponding to a second subset of the plurality of segment level checksums that compare favorably to a corresponding second subset of the plurality of segment overwrite checksum values. The first subset of the plurality of data segments and the second subset of the plurality of data segments can be mutually exclusive and collectively exhaustive with respect to the plurality of data segments of the original data object.

In various embodiments, generating the segment validation data includes comparing only a selected subset of the plurality of segment level checksums to a corresponding subset of the plurality of segment overwrite checksum values. For example, the selected subset can be identified based on a determination to overwrite only a portion of the data object that includes a subset of the plurality of data segments corresponding to the selected subset of the plurality of segment level checksums. In particular, based on the edit or append determined for update, the DST processing unit can determine the selected subset of the plurality of segments to be checked, and can generate segment validation data with respect to only the selected subset of the plurality of segments.

The DST processing unit can facilitate performance of overwriting the first subset of the plurality of data segments of the original data object with a corresponding first subset of a plurality of data segments of the updated data object. The DST processing unit can forego overwriting of the second subset of the plurality of data segments of the original data object and/or can transmit a notification indicating the determination to forego the overwriting of the original data object.

In various embodiments, the checksum metadata 960 is modified to generate updated checksum metadata for the updated data object, and replacement of the checksum metadata with the updated checksum metadata is facilitated in storage. Modifying the checksum metadata can include replacing the object level checksum with the object overwrite checksum value when the validation level data indicates a data object overwrite level. Modifying the checksum metadata can include replacing the first subset of the of the plurality of region level checksums with the first subset of the plurality of region overwrite checksum values when the validation level data indicates a data region overwrite level. Modifying the checksum metadata can include replacing the first subset of the of the plurality of segment level checksums with the first subset of the plurality of segment overwrite checksum values when the validation level data indicates a data segment overwrite level.

In various embodiments, the DST processing unit determines to overwrite a second original data object stored in the plurality of storage units with a second updated data object. The DST processing unit can determine to forego the processing of second checksum metadata associated with the second original data object in response to determining an available memory resource level of the DST processing unit compares unfavorably to a memory resource threshold, and can facilitating performance of overwriting the entire original data object with the updated data object without processing the second checksum metadata.

In various embodiments, the DST processing unit will only generate region validation data in response to first determining the object level checksums do not match. For example, the DST processing unit can first determine the object validation data indicates the object overwrite checksum value compares unfavorably to the one object level checksum. Instead of automatically overwriting the data object as a whole with the updated data object, facilitating performance of overwriting the original data object with the updated data object can include generating the region validation data for the original data object. The DST processing unit can then facilitate performance of overwriting the first subset of the plurality of data regions of the original data object with the corresponding first subset of the plurality of data regions of the updated data object.

Similarly, in various embodiments, the DST processing unit will only generate segment validation data in response to first determining the corresponding region level checksums do not match. For example, the DST processing unit can first generate the region validation data and determine the first subset of the plurality of data regions of the original data object corresponding to the first subset of the plurality of region level checksums that compare unfavorably to the corresponding first subset of the plurality of region overwrite checksum values. Instead of automatically overwriting these data regions of the first subset as a whole with the corresponding updated data regions of the updated data object, facilitating performance of overwriting the first subset of the plurality of data regions of the original data object with the corresponding first subset of the plurality of data regions of the updated data object can include determining the subset of the plurality of data segments that are included in the first subset of the plurality of data regions. Next, segment validation data can be generated for the original data object by comparing only ones of the plurality of segment level checksums that correspond this plurality of data segments that are included in the first subset of the plurality of data regions to their corresponding ones of the plurality of segment overwrite checksum values to determine the first subset of the plurality of data segments of the original data object to be overwritten. The DST processing unit can then facilitate performance of overwriting this determined first subset of the plurality of data segments of the original data object with the corresponding first subset of the plurality of data segments of the updated data object.

In various embodiments, the DST processing unit can determine to update the validation level data for one or more objects, even if they are not being overwritten at the time. For example, the DST processing unit can update the validation level data for a data object in response to determining changes in access frequency of a data object, data object size, based on increased system constraints, based on user input to the system such as user selection of a new validation level, or based on other information. In such embodiments, the checksums at the region level and/or segment level may need to be calculated and stored if they are not yet being stored in the metadata. In particular, in response to updating the validation level data from indicating the data object overwrite level to indicate the data region overwrite level, the DST processing unit can calculate the plurality of region level checksums by performing a checksum function on the plurality of data regions of the original data object, for example, in response to determining the plurality of region level checksums are not yet stored in the checksum metadata. The checksum metadata for the original data object can be modified by generating updated checksum metadata that includes the plurality of region level checksums, and the DST processing unit can facilitate replacement of the checksum metadata with the updated checksum metadata in storage. Similarly, in response to updating the validation level data from indicating the data region overwrite level to indicate the data segment overwrite level, the DST processing unit can calculate the plurality of segment level checksums by performing a checksum function on the plurality of data segments of the original data object, for example, in response to determining the plurality of segment level checksums are not yet stored in the checksum metadata. The checksum metadata for the original data object can be modified by generating updated checksum metadata that includes the plurality of segment level checksums, and the DST processing unit can facilitate replacement of the checksum metadata with the updated checksum metadata in storage.

FIGS. 10A-10D are flowcharts illustrating an example of overwriting data objects. In particular, a method is presented for use in association with one or more functions and features described in conjunction with FIGS. 1-9D, for execution by a dispersed storage and task (DST) processing unit that includes a processor or via another processing system of a dispersed storage network that includes at least one processor and memory that stores instruction that configure the processor or processors to perform the steps described below.

Step 1002 includes determining to overwrite an original data object stored in a plurality of storage units with an updated data object. The original data object can include a plurality of data regions, each of the plurality of data regions can include a plurality of data segments. In some embodiments, each of the plurality of data segments was dispersed storage error encoded to produce a set of encoded data slices stored in a set of storage units of the plurality of storage units.

Step 1004 includes retrieving checksum metadata associated with the original data object in response to determining to overwrite an original data object. The checksum metadata can include one object level checksum corresponding to the original data object. Alternatively or in addition, the checksum metadata can further include a plurality of region level checksums corresponding to the plurality of data regions of the original data object. Alternatively or in addition, the checksum metadata can further include a plurality of segment level checksums corresponding to the plurality of data segments of the plurality of data regions.

Figure 10A:
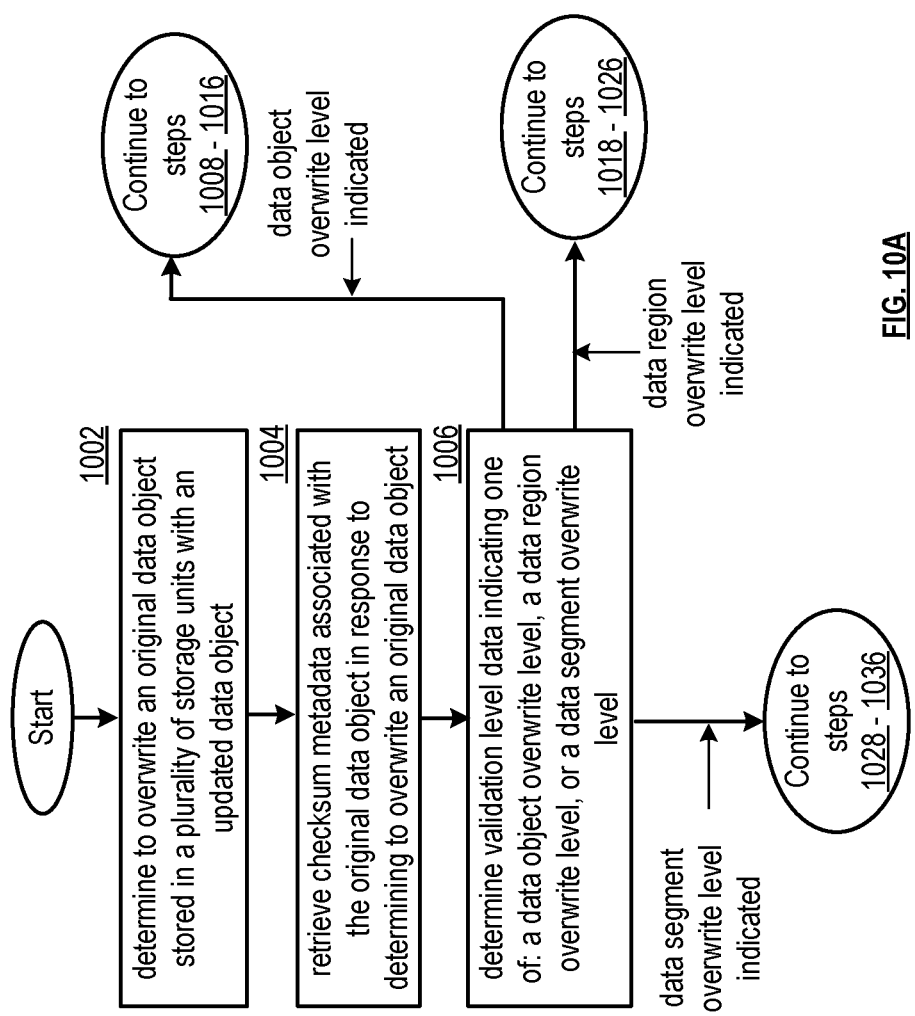

Step 1006 includes determining validation level data, indicating a data object overwrite level, a data region overwrite level, or a data segment overwrite level. As shown in FIG. 10A, the method continues to steps 1008-1016 of FIG. 10B when the validation level data indicates a data object overwrite level, the method continues to steps 1018-1026 of FIG. 10C when the validation level data indicates a data region overwrite level, and the method continues to steps 1028-1036 of FIG. 10D when the validation level data indicates a data segment overwrite level.

When the validation level data indicates a data object overwrite level, the method proceeds to step 1008 as shown in FIG. 10B. Step 1008 includes extracting an object level checksum from the checksum metadata. Step 1010 includes determining an object overwrite checksum value. Step 1012 includes generating object validation data by comparing the object overwrite checksum value to the object level checksum. Step 1014 includes facilitating performance of overwriting the original data object with the updated data object when the object validation data indicates the object overwrite checksum value compares unfavorably to the one object level checksum. Step 1016 includes foregoing overwriting of the original data object when the object validation data indicates the object overwrite checksum value compares favorably to the object level checksum.

Figure 10C:
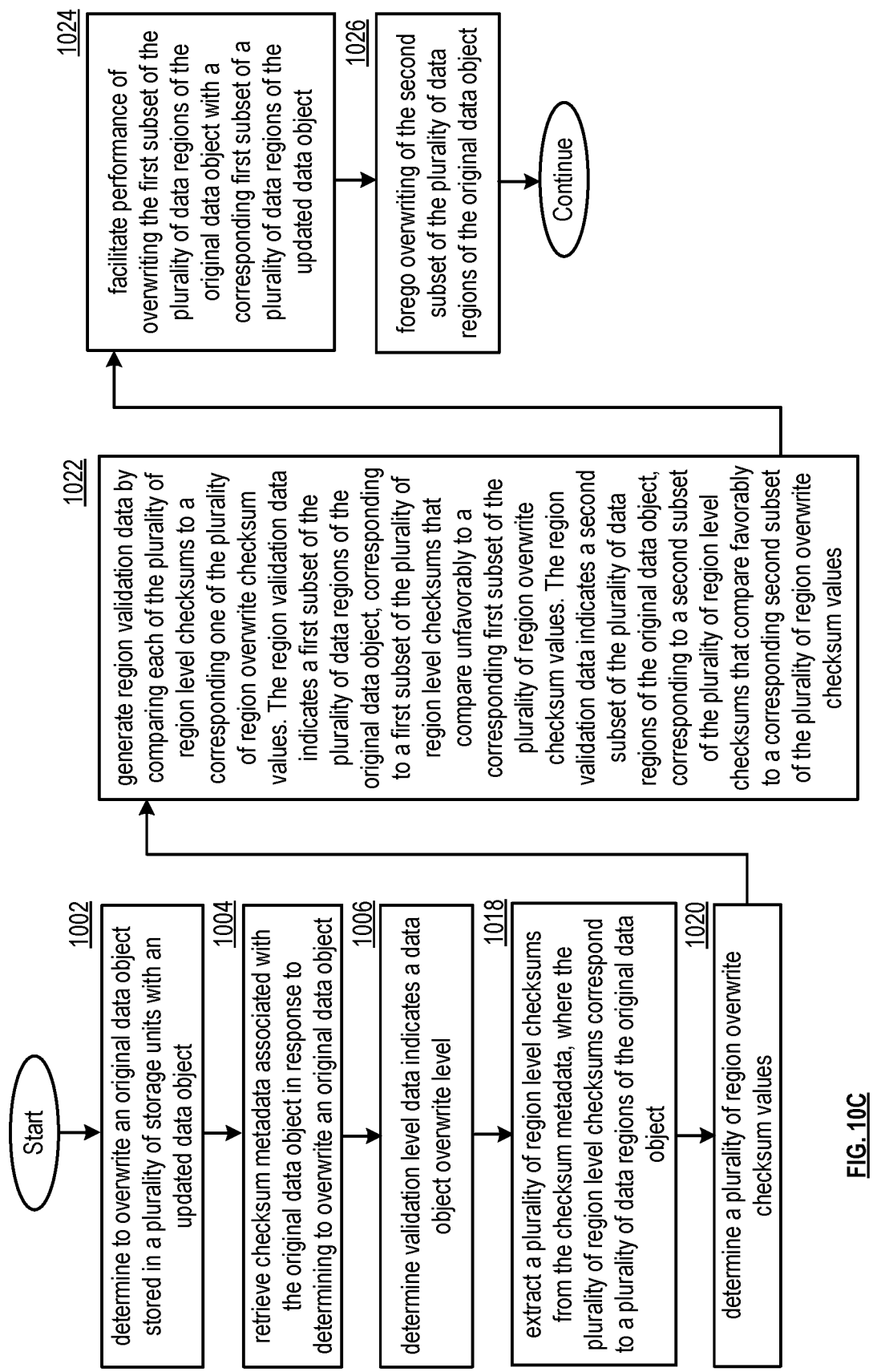

When the validation level data indicates a data region overwrite level, the method proceeds from step 1006 to step 1018 as shown in FIG. 10C. Step 1018 includes extracting a plurality of region level checksums from the checksum metadata, where the plurality of region level checksums correspond to the plurality of data regions of the original data object. Step 1020 includes determining a plurality of region overwrite checksum values. Step 1022 includes generating region validation data by comparing each of the plurality of region level checksums to a corresponding one of the plurality of region overwrite checksum values. The region validation data indicates a first subset of the plurality of data regions of the original data object, corresponding to a first subset of the plurality of region level checksums that compare unfavorably to a corresponding first subset of the plurality of region overwrite checksum values. The region validation data indicates a second subset of the plurality of data regions of the original data object, corresponding to a second subset of the plurality of region level checksums that compare favorably to a corresponding second subset of the plurality of region overwrite checksum values. The first subset of the plurality of data regions and the second subset of the plurality of data regions are mutually exclusive and collectively exhaustive with respect to the plurality of data regions of the original data object.

Step 1024 includes facilitating performance of overwriting the first subset of the plurality of data regions of the original data object with a corresponding first subset of a plurality of data regions of the updated data object. Step 1026 includes foregoing overwriting of the second subset of the plurality of data regions of the original data object.

Figure 10D:
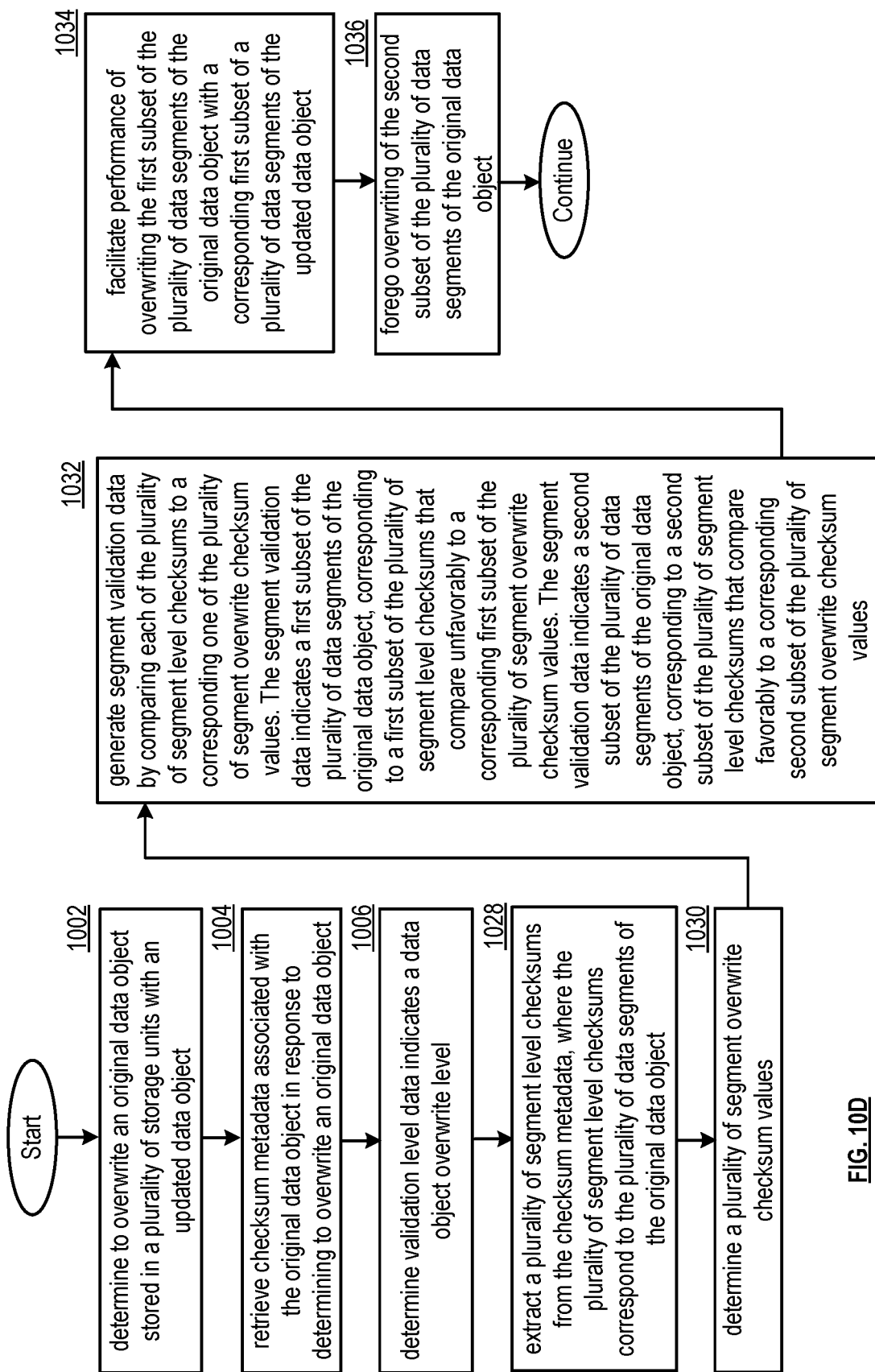

When the validation level data indicates a data segment overwrite level, the method proceeds from step 1006 to step 1028 as shown in FIG. 10D. Step 1028 includes extracting a plurality of segment level checksums from the checksum metadata, where the plurality of segment level checksums correspond to the plurality of data segments of the original data object. Step 1030 includes determining a plurality of segment overwrite checksum values. Step 1032 includes generating segment validation data by comparing each of the plurality of segment level checksums to a corresponding one of the plurality of segment overwrite checksum values. The segment validation data indicates a first subset of the plurality of data segments of the original data object, corresponding to a first subset of the plurality of segment level checksums that compare unfavorably to a corresponding first subset of the plurality of segment overwrite checksum values. The segment validation data indicates a second subset of the plurality of data segments of the original data object, corresponding to a second subset of the plurality of segment level checksums that compare favorably to a corresponding second subset of the plurality of segment overwrite checksum values. The first subset of the plurality of data segments and the second subset of the plurality of data segments are mutually exclusive and collectively exhaustive with respect to the plurality of data segments of the original data object.

Step 1034 includes facilitating performance of overwriting the first subset of the plurality of data segments of the original data object with a corresponding first subset of a plurality of data segments of the updated data object. Step 1036 includes foregoing overwriting of the second subset of the plurality of data segments of the original data object.

In various embodiments, generating the region validation data in step 1022 includes comparing only a selected subset of the plurality of region level checksums to a corresponding subset of the plurality of region overwrite checksum values. For example, the selected subset can be identified based on a determination to overwrite only a portion of the data object that includes a subset of the plurality of data regions corresponding to the selected subset of the plurality of region level checksums. In various embodiments, generating the segment validation data in step 1032 includes comparing only a selected subset of the plurality of segment level checksums to a corresponding subset of the plurality of segment overwrite checksum values. For example, the selected subset can be identified based on a determination to overwrite only a portion of the data object that includes a subset of the plurality of data segments corresponding to the selected subset of the plurality of segment level checksums.

In various embodiments, the checksum metadata includes the object level checksum corresponding to the original data object. The checksum metadata further includes the plurality of region level checksums corresponding to the plurality of data regions of the original data object, and the checksum metadata further includes the plurality of segment level checksums corresponding to the plurality of data segments of the plurality of data regions.

In various embodiments, the checksum metadata is modified to generate updated checksum metadata for the updated data object. Replacement of the checksum metadata with the updated checksum metadata in storage is facilitated. In various embodiments, modifying the checksum metadata includes replacing the object level checksum with the object overwrite checksum value when the validation level data indicates a data object overwrite level. In various embodiments, modifying the checksum metadata includes replacing the first subset of the of the plurality of region level checksums with the first subset of the plurality of region overwrite checksum values when the validation level data indicates a data region overwrite level. In various embodiments, modifying the checksum metadata includes replacing the first subset of the of the plurality of segment level checksums with the first subset of the plurality of segment overwrite checksum values when the validation level data indicates a data segment overwrite level.

In various embodiments, the object overwrite checksum value is calculated by performing an object checksum function on the updated data object when the validation level data indicates a data object overwrite level. In various embodiments, each of the plurality of region overwrite checksum values are calculated by performing a region checksum function on a corresponding one of the plurality of data regions of the updated data object when the validation level data indicates a data region overwrite level. In various embodiments, each of the plurality of segment overwrite checksum values are calculated by performing a segment checksum function on a corresponding one of the plurality of data segments of the updated data object when the validation level data indicates a data segment overwrite level.

In various embodiments, the validation level data is received from a client device. The validation level data is generated based on user input to the client device. In various embodiments, the validation level data is determined as a function of an update frequency level of the original data object. For example, the data object overwrite level is selected for a first data object, and the data segment overwrite level is selected for a second data object in response to determining the second data object is updated more frequently than the first data object. In various embodiments, validation level data as a function of a size of the original data object. For example, the data object overwrite level is selected for a first data object, and the data segment overwrite level is selected for a second data object in response to determining the second data object is larger than the first data object.

In various embodiments, the method includes determining to overwrite a second original data object stored in the plurality of storage units with a second updated data object. The method further includes foregoing processing of second checksum metadata associated with the second original data object in response to determining an available memory resource level of the DST processing unit compares unfavorably to a memory resource threshold. Performance of overwriting the original data object with the updated data object is facilitated.

In various embodiments, performance of overwriting the original data object with the updated data object includes generating the region validation data for the original data object, and further includes facilitating performance of overwriting the first subset of the plurality of data regions of the original data object with the corresponding first subset of the plurality of data regions of the updated data object. For example, performing step 1014 can include performing some or all of steps 1018-1026, and/or can include modifying the validation level data to reflect a change from the data object overwrite level to the data region overwrite level for the data object.

In various embodiments, facilitating performance of overwriting the first subset of the plurality of data regions of the original data object with the corresponding first subset of the plurality of data regions of the updated data object includes determining a third subset of the plurality of data segments that are included in the first subset of the plurality of data regions. The segment validation data is generated for the original data object by comparing only ones of the plurality of segment level checksums that correspond to the third subset of the plurality of data segments to corresponding ones of the plurality of segment overwrite checksum values. Performance of overwriting the first subset of the plurality of data segments of the original data object with the corresponding first subset of the plurality of data segments of the updated data object. For example, performing step 1024 can include performing some or all of steps 1028-1036, and/or can include modifying the validation level data to reflect a change from the data region overwrite level to the data segment overwrite level for the data object.

In various embodiments, the plurality of region level checksums can be calculated by performing a checksum function on the plurality of data regions of the original data object in response to updating the validation level data from indicating the data object overwrite level to indicate the data region overwrite level. The checksum metadata for the original data object can be modified by generating updated checksum metadata that includes the plurality of region level checksums. Replacement of the checksum metadata with the updated checksum metadata in storage can be facilitated.

In various embodiments, the plurality of segment level checksums can be calculated by performing a checksum function on the plurality of data segments of the original data object in response to updating the validation level data from indicating the data region overwrite level to indicate the data segment overwrite level. The checksum metadata for the original data object can be modified by generating updated checksum metadata that includes the plurality of segment level checksums. Replacement of the checksum metadata with the updated checksum metadata in storage can be facilitated.

In various embodiments, a non-transitory computer readable storage medium includes at least one memory section that stores operational instructions that, when executed by a processing system of a dispersed storage network (DSN) that includes a processor and a memory, causes the processing system to determine to overwrite an original data object stored in a plurality of storage units with an updated data object. Validation level data can be determined, where the validation level data indicates a data object overwrite level, a data region overwrite level, or a data segment overwrite level. Checksum metadata associated with the original data object can be retrieved in response to determining to overwrite an original data object.

When the validation level data indicates a data object overwrite level, an object level checksum can be extracted from the checksum metadata, and an object overwrite checksum value, corresponding to the updated data object, can be determined. Object validation data can be generated by comparing the object overwrite checksum value to the object level checksum. The original data object can be overwritten with the updated data object when the object validation data indicates the object overwrite checksum value compares unfavorably to the one object level checksum. Overwriting of the original data object can be foregone when the object validation data indicates the object overwrite checksum value compares favorably to the object level checksum.

When the validation level data indicates a data region overwrite level, a plurality of region level checksums are extracted from the checksum metadata, where the plurality of region level checksums correspond to the plurality of data regions of the original data object. A plurality of region overwrite checksum values are determined. Region validation data is generated by comparing each of the plurality of region level checksums to a corresponding one of the plurality of region overwrite checksum values. The region validation data indicates a first subset of the plurality of data regions of the original data object, corresponding to a first subset of the plurality of region level checksums that compare unfavorably to a corresponding first subset of the plurality of region overwrite checksum values. The region validation data indicates a second subset of the plurality of data regions of the original data object, corresponding to a second subset of the plurality of region level checksums that compare favorably to a corresponding second subset of the plurality of region overwrite checksum values. The first subset of the plurality of data regions of the original data object can be overwritten with a corresponding first subset of a plurality of data regions of the updated data object. Overwriting of the second subset of the plurality of data regions of the original data object can be foregone.

When the validation level data indicates a data segment overwrite level, a plurality of segment level checksums can be extracted from the checksum metadata, where the plurality of segment level checksums correspond to the plurality of data segments of the original data object. A plurality of segment overwrite checksum values are determined. Segment validation data is generated by comparing each of the plurality of segment level checksums to a corresponding one of the plurality of segment overwrite checksum values. The segment validation data indicates a first subset of the plurality of data segments of the original data object, corresponding to a first subset of the plurality of segment level checksums that compare unfavorably to a corresponding first subset of the plurality of segment overwrite checksum values. The segment validation data indicates a second subset of the plurality of data segments of the original data object, corresponding to a second subset of the plurality of segment level checksums that compare favorably to a corresponding second subset of the plurality of segment overwrite checksum values. The first subset of the plurality of data segments of the original data object can be overwritten with a corresponding first subset of a plurality of data segments of the updated data object. Overwriting of the second subset of the plurality of data segments of the original data object can be foregone.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing system", "processing module", "processing circuit", "processor", and/or "processing unit" may be used interchangeably, and may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing system, processing module, module, processing circuit, and/or processing unit may be, or further include, memory and/or an integrated memory element, which may be a single memory device, a plurality of memory devices, and/or embedded circuitry of another processing system, processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing system, processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing system, processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing system, processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by a dispersed storage and task (DST) processing unit that includes a processor, the method comprises:
   determining to overwrite an original data object stored in a plurality of storage units with an updated data object, wherein the original data object includes a plurality of data regions, wherein each of the plurality of data regions includes a plurality of data segments, and wherein each of the plurality of data segments was dispersed storage error encoded to produce a set of encoded data slices stored in a set of storage units of the plurality of storage units;
   retrieving checksum metadata associated with the original data object in response to determining to overwrite an original data object, wherein the checksum metadata includes one object level checksum corresponding to the original data object, wherein the checksum metadata further includes a plurality of region level checksums corresponding to the plurality of data regions of the original data object, and wherein the checksum metadata further includes a plurality of segment level checksums corresponding to the plurality of data segments of the plurality of data regions;
   determining validation level data indicating one of: a data object overwrite level, a data region overwrite level, or a data segment overwrite level;
   when the validation level data indicates a data object overwrite level:
      extracting an object level checksum from the checksum metadata;
      determining an object overwrite checksum value;
      generating object validation data by comparing the object overwrite checksum value to the object level checksum;
      facilitating performance of overwriting the original data object with the updated data object when the object validation data indicates the object overwrite checksum value compares unfavorably to the one object level checksum; and
      foregoing overwriting of the original data object when the object validation data indicates the object overwrite checksum value compares favorably to the object level checksum;
   when the validation level data indicates a data region overwrite level:
      extracting a plurality of region level checksums from the checksum metadata, wherein the plurality of region level checksums corresponds to the plurality of data regions of the original data object;
      determining a plurality of region overwrite checksum values;
      generating region validation data by comparing each of the plurality of region level checksums to a corresponding one of the plurality of region overwrite checksum values, wherein the region validation data indicates a first subset of the plurality of data regions of the original data object, corresponding to a first subset of the plurality of region level checksums that compare unfavorably to a corresponding first subset of the plurality of region overwrite checksum values, wherein the region validation data indicates a second subset of the plurality of data regions of the original data object, corresponding to a second subset of the plurality of region level checksums that compare favorably to a corresponding second subset of the plurality of region overwrite checksum values, and wherein the first subset of the plurality of data regions and the second subset of the plurality of data regions are mutually exclusive and collectively exhaustive with respect to the plurality of data regions of the original data object;
      facilitating performance of overwriting the first subset of the plurality of data regions of the original data object with a corresponding first subset of a plurality of data regions of the updated data object; and
      foregoing overwriting of the second subset of the plurality of data regions of the original data object;
   and;
   when the validation level data indicates a data segment overwrite level:
      extracting a plurality of segment level checksums from the checksum metadata, wherein the plurality of segment level checksums corresponds to the plurality of data segments of the original data object;
      determining a plurality of segment overwrite checksum values;
      generating segment validation data by comparing each of the plurality of segment level checksums to a corresponding one of the plurality of segment overwrite checksum values, wherein the segment validation data indicates a first subset of the plurality of data segments of the original data object, corresponding to a first subset of the plurality of segment level checksums that compare unfavorably to a corresponding first subset of the plurality of segment overwrite checksum values, wherein the segment validation data indicates a second subset of the plurality of data segments of the original data object, corresponding to a second subset of the plurality of segment level checksums that compare favorably to a corresponding second subset of the plurality of segment overwrite checksum values, and wherein the first subset of the plurality of data segments and the second subset of the plurality of data segments are mutually exclusive and collectively exhaustive with respect to the plurality of data segments of the original data object;
      facilitating performance of overwriting the first subset of the plurality of data segments of the original data object with a corresponding first subset of a plurality of data segments of the updated data object; and foregoing overwriting of the second subset of the plurality of data segments of the original data object.

2. The method of claim 1, wherein the checksum metadata includes the object level checksum corresponding to the original data object, wherein the checksum metadata further includes the plurality of region level checksums corresponding to the plurality of data regions of the original data object, and wherein the checksum metadata further includes the plurality of segment level checksums corresponding to the plurality of data segments of the plurality of data regions.

3. The method of claim 1, further comprising:

modifying the checksum metadata to generate updated checksum metadata for the updated data object; and facilitating replacement of the checksum metadata with the updated checksum metadata in storage.

4. The method of claim 3, wherein modifying the checksum metadata includes replacing the object level checksum with the object overwrite checksum value when the validation level data indicates a data object overwrite level;

wherein modifying the checksum metadata includes replacing the first subset of the of the plurality of region level checksums with the first subset of the plurality of region overwrite checksum values when the validation level data indicates a data region overwrite level; and wherein modifying the checksum metadata includes replacing the first subset of the of the plurality of segment level checksums with the first subset of the plurality of segment overwrite checksum values when the validation level data indicates a data segment overwrite level.

5. The method of claim 1, further comprising:

calculating the object overwrite checksum value by performing an object checksum function on the updated data object when the validation level data indicates a data object overwrite level;

calculating each of the plurality of region overwrite checksum values by performing a region checksum function on a corresponding one of the plurality of data regions of the updated data object when the validation level data indicates a data region overwrite level; and calculating each of the plurality of segment overwrite checksum values by performing a segment checksum function on a corresponding one of the plurality of data segments of the updated data object when the validation level data indicates a data segment overwrite level.

6. The method of claim 1, further comprising:

receiving the validation level data from a client device, wherein the validation level data is generated based on user input to the client device.

7. The method of claim 1, further comprising determining the validation level data as a function of an update frequency level of the original data object, wherein the data object overwrite level is selected for a first data object, and wherein the data segment overwrite level is selected for a second data object in response to determining the second data object is updated more frequently than the first data object.

8. The method of claim 1, further comprising determining the validation level data as a function of a size of the original data object, wherein the data object overwrite level is selected for a first data object, and wherein the data segment overwrite level is selected for a second data object in response to determining the second data object is larger than the first data object.

9. The method of claim 1, further comprising determining to overwrite a second original data object stored in the plurality of storage units with a second updated data object;

foregoing processing of second checksum metadata associated with the second original data object in response to determining an available memory resource level of the DST processing unit compares unfavorably to a memory resource threshold; and facilitating performance of overwriting the original data object with the updated data object.

10. The method of claim 1, wherein performance of overwriting the original data object with the updated data object includes:

generating the region validation data for the original data object; and facilitating performance of overwriting the first subset of the plurality of data regions of the original data object with the corresponding first subset of the plurality of data regions of the updated data object.

11. The method of claim 10, wherein facilitating performance of overwriting the first subset of the plurality of data regions of the original data object with the corresponding first subset of the plurality of data regions of the updated data object includes:

determining a third subset of the plurality of data segments that are included in the first subset of the plurality of data regions;

generating the segment validation data for the original data object by comparing only ones of the plurality of segment level checksums that correspond to the third subset of the plurality of data segments to corresponding ones of the plurality of segment overwrite checksum values; and facilitating performance of overwriting the first subset of the plurality of data segments of the original data object with the corresponding first subset of the plurality of data segments of the updated data object.

12. The method of claim 1, further comprising:

calculating the plurality of region level checksums by performing a checksum function on the plurality of data regions of the original data object in response to updating the validation level data from indicating the data object overwrite level to indicate the data region overwrite level;

modifying the checksum metadata for the original data object by generating updated checksum metadata that includes the plurality of region level checksums; and facilitating replacement of the checksum metadata with the updated checksum metadata in storage.

13. The method of claim 1, further comprising:

calculating the plurality of segment level checksums by performing a checksum function on the plurality of data segments of the original data object in response to updating the validation level data from indicating the data region overwrite level to indicate the data segment overwrite level;

modifying the checksum metadata for the original data object by generating updated checksum metadata that includes the plurality of segment level checksums; and facilitating replacement of the checksum metadata with the updated checksum metadata in storage.

14. A processing system of a dispersed storage and task (DST) processing unit comprises:
- at least one processor;
- a memory that stores operational instructions, that when executed by the at least one processor cause the processing system to:
- determine to overwrite an original data object stored in a plurality of storage units with an updated data object, wherein the original data object includes a plurality of data regions, wherein each of the plurality of data regions includes a plurality of data segments, and wherein each of the plurality of data segments was dispersed storage error encoded to produce a set of encoded data slices stored in a set of storage units of the plurality of storage units;
- retrieve checksum metadata associated with the original data object in response to determining to overwrite an original data object, wherein the checksum metadata includes one object level checksum corresponding to the original data object, wherein the checksum metadata further includes a plurality of region level checksums corresponding to the plurality of data regions of the original data object, and wherein the checksum metadata further includes a plurality of segment level checksums corresponding to the plurality of data segments of the plurality of data regions;
- determine validation level data indicating one of: a data object overwrite level, a data region overwrite level, or a data segment overwrite level;
- when the validation level data indicates a data object overwrite level:
  - extract an object level checksum from the checksum metadata;
  - determine an object overwrite checksum value;
  - generate object validation data by comparing the object overwrite checksum value to the object level checksum;
  - facilitate performance of overwriting the original data object with the updated data object when the object validation data indicates the object overwrite checksum value compares unfavorably to the one object level checksum; and
  - forego overwriting of the original data object when the object validation data indicates the object overwrite checksum value compares favorably to the object level checksum;
- when the validation level data indicates a data region overwrite level:
  - extract a plurality of region level checksums from the checksum metadata, wherein the plurality of region level checksums corresponds to the plurality of data regions of the original data object;
  - determine a plurality of region overwrite checksum values;
  - generate region validation data by comparing each of the plurality of region level checksums to a corresponding one of the plurality of region overwrite checksum values, wherein the region validation data indicates a first subset of the plurality of data regions of the original data object, corresponding to a first subset of the plurality of region level checksums that compare unfavorably to a corresponding first subset of the plurality of region overwrite checksum values, wherein the region validation data indicates a second subset of the plurality of data regions of the original data object, corresponding to a second subset of the plurality of region level checksums that compare favorably to a corresponding second subset of the plurality of region overwrite checksum values, and wherein the first subset of the plurality of data regions and the second subset of the plurality of data regions are mutually exclusive and collectively exhaustive with respect to the plurality of data regions of the original data object;
  - facilitate performance of overwriting the first subset of the plurality of data regions of the original data object with a corresponding first subset of a plurality of data regions of the updated data object; and
  - forego overwriting of the second subset of the plurality of data regions of the original data object;

and;
- when the validation level data indicates a data segment overwrite level:
  - extract a plurality of segment level checksums from the checksum metadata, wherein the plurality of segment level checksums corresponds to the plurality of data segments of the original data object;
  - determine a plurality of segment overwrite checksum values;
  - generate segment validation data by comparing each of the plurality of segment level checksums to a corresponding one of the plurality of segment overwrite checksum values, wherein the segment validation data indicates a first subset of the plurality of data segments of the original data object, corresponding to a first subset of the plurality of segment level checksums that compare unfavorably to a corresponding first subset of the plurality of segment overwrite checksum values, wherein the segment validation data indicates a second subset of the plurality of data segments of the original data object, corresponding to a second subset of the plurality of segment level checksums that compare favorably to a corresponding second subset of the plurality of segment overwrite checksum values, and wherein the first subset of the plurality of data segments and the second subset of the plurality of data segments are mutually exclusive and collectively exhaustive with respect to the plurality of data segments of the original data object;
  - facilitate performance of overwriting the first subset of the plurality of data segments of the original data object with a corresponding first subset of a plurality of data segments of the updated data object; and
  - forego overwriting of the second subset of the plurality of data segments of the original data object.

15. The processing system of claim 14, wherein the checksum metadata includes the object level checksum corresponding to the original data object, wherein the checksum metadata further includes the plurality of region level checksums corresponding to the plurality of data regions of the original data object, and wherein the checksum metadata further includes the plurality of segment level checksums corresponding to the plurality of data segments of the plurality of data regions.

16. The processing system of claim 14, wherein the operational instructions, when executed by the at least one processor, further cause the processing system to:
- modify the checksum metadata to generate updated checksum metadata for the updated data object; and
- facilitate replacement of the checksum metadata with the updated checksum metadata in storage.

17. The processing system of claim 14, wherein the operational instructions, when executed by the at least one processor, further cause the processing system to:
- calculate the object overwrite checksum value by performing an object checksum function on the updated data object when the validation level data indicates a data object overwrite level;
- calculate each of the plurality of region overwrite checksum values by performing a region checksum function on a corresponding one of the plurality of data regions of the updated data object when the validation level data indicates a data region overwrite level; and
- calculate each of the plurality of segment overwrite checksum values by performing a segment checksum function on a corresponding one of the plurality of data segments of the updated data object when the validation level data indicates a data segment overwrite level.

18. The processing system of claim 14, wherein the operational instructions, when executed by the at least one processor, further cause the processing system to:
- determine to overwrite a second original data object stored in the plurality of storage units with a second updated data object;
- forego processing of second checksum metadata associated with the second original data object in response to determining an available memory resource level of the DST processing unit compares unfavorably to a memory resource threshold; and
- facilitate performance of overwriting the original data object with the updated data object.

19. The processing system of claim 14, wherein the operational instructions, when executed by the at least one processor, further cause the processing system to:
- calculate the plurality of region level checksums by performing a checksum function on the plurality of data regions of the original data object in response to updating the validation level data from indicating the data object overwrite level to indicate the data region overwrite level;
- modify the checksum metadata for the original data object by generating updated checksum metadata that includes the plurality of region level checksums; and
- facilitate replacement of the checksum metadata with the updated checksum metadata in storage.

20. A non-transitory computer readable storage medium comprises:
- at least one memory section that stores operational instructions that, when executed by a processing system of a dispersed storage network (DSN) that includes a processor and a memory, causes the processing system to:
  - determine to overwrite an original data object stored in a plurality of storage units with an updated data object, wherein the original data object includes a plurality of data regions, wherein each of the plurality of data regions includes a plurality of data segments, and wherein each of the plurality of data segments was dispersed storage error encoded to produce a set of encoded data slices stored in a set of storage units of the plurality of storage units;
  - retrieve checksum metadata associated with the original data object in response to determining to overwrite an original data object, wherein the checksum metadata includes one object level checksum corresponding to the original data object, wherein the checksum metadata further includes a plurality of region level checksums corresponding to the plurality of data regions of the original data object, and wherein the checksum metadata further includes a plurality of segment level checksums corresponding to the plurality of data segments of the plurality of data regions;
  - determine validation level data indicating one of: a data object overwrite level, a data region overwrite level, or a data segment overwrite level;
  - when the validation level data indicates a data object overwrite level:
    - extract an object level checksum from the checksum metadata;
    - determine an object overwrite checksum value;
    - generate object validation data by comparing the object overwrite checksum value to the object level checksum;
    - facilitate performance of overwriting the original data object with the updated data object when the object validation data indicates the object overwrite checksum value compares unfavorably to the one object level checksum; and
    - forego overwriting of the original data object when the object validation data indicates the object overwrite checksum value compares favorably to the object level checksum;
  - when the validation level data indicates a data region overwrite level:
    - extract a plurality of region level checksums from the checksum metadata, wherein the plurality of region level checksums corresponds to the plurality of data regions of the original data object;
    - determine a plurality of region overwrite checksum values;
    - generate region validation data by comparing each of the plurality of region level checksums to a corresponding one of the plurality of region overwrite checksum values, wherein the region validation data indicates a first subset of the plurality of data regions of the original data object, corresponding to a first subset of the plurality of region level checksums that compare unfavorably to a corresponding first subset of the plurality of region overwrite checksum values, wherein the region validation data indicates a second subset of the plurality of data regions of the original data object, corresponding to a second subset of the plurality of region level checksums that compare favorably to a corresponding second subset of the plurality of region overwrite checksum values, and wherein the first subset of the plurality of data regions and the second subset of the plurality of data regions are mutually exclusive and collectively exhaustive with respect to the plurality of data regions of the original data object;
    - facilitate performance of overwriting the first subset of the plurality of data regions of the original data object with a corresponding first subset of a plurality of data regions of the updated data object; and
    - forego overwriting of the second subset of the plurality of data regions of the original data object;
  and;
  - when the validation level data indicates a data segment overwrite level:
    - extract a plurality of segment level checksums from the checksum metadata, wherein the plurality of segment level checksums corresponds to the plurality of data segments of the original data object;
    - determine a plurality of segment overwrite checksum values;

generate segment validation data by comparing each of the plurality of segment level checksums to a corresponding one of the plurality of segment overwrite checksum values, wherein the segment validation data indicates a first subset of the plurality of data segments of the original data object, corresponding to a first subset of the plurality of segment level checksums that compare unfavorably to a corresponding first subset of the plurality of segment overwrite checksum values, wherein the segment validation data indicates a second subset of the plurality of data segments of the original data object, corresponding to a second subset of the plurality of segment level checksums that compare favorably to a corresponding second subset of the plurality of segment overwrite checksum values, and wherein the first subset of the plurality of data segments and the second subset of the plurality of data segments are mutually exclusive and collectively exhaustive with respect to the plurality of data segments of the original data object;

facilitate performance of overwriting the first subset of the plurality of data segments of the original data object with a corresponding first subset of a plurality of data segments of the updated data object; and forego overwriting of the second subset of the plurality of data segments of the original data object.

\* \* \* \* \*